LATERAL PNP-NPN COMPOSITE MONOLITHIC DIFFERENTIAL AMPLIFIER

Filed Nov. 22, 1968 2 Sheets-Sheet 1

INVENTOR.
James E. Solomon

BY Mueller, Aichele & Rauner

ATTY'S.

LATERAL PNP-NPN COMPOSITE MONOLITHIC DIFFERENTIAL AMPLIFIER

Filed Nov. 22, 1968

INVENTOR.
James E. Solomon
BY
Mueller, Aichele & Rauner
ATTY'S.

United States Patent Office 3,538,449
Patented Nov. 3, 1970

3,538,449

LATERAL PNP-NPN COMPOSITE MONOLITHIC DIFFERENTIAL AMPLIFIER

James E. Solomon, Phoenix, Ariz., assignor to Motorola, Inc., Franklin Park, Ill., a corporation of Illinois Filed Nov. 22, 1968, Ser. No. 778,056
Int. Cl. H03f *3/18, 3/68*
U.S. Cl. 330—30 15 Claims

ABSTRACT OF THE DISCLOSURE

Disclosed is a differential amplifier adapted for monolithic integrated circuit fabrication which includes a pair of input NPN transistors connected to a pair of output lateral PNP transistors. The lateral PNP transistors clamp the collector voltage of the input NPN transistors so that the input NPN transistors may be fabricated to have a high current gain and thus require very low input currents. At the same time, the output currents from the output lateral PNP transistors are made independent of PNP common-emitter current gain (beta), and the frequency response of the complete amplifier is improved over other prior art approaches.

BACKGROUND OF THE INVENTION

This invention relates generally to operational amplifiers and more particularly to a monolithic differential amplifier employing NPN narrow basewidth input transistors and lateral PNP output transistors.

Operational amplifiers having only two cascaded differential transistor stages are well known in the art. By using active current sources with each transistor stage, and such current sources may be easily fabricated in monolithic integrated circuit form, a desirable high gain amplifier can be fabricated without requiring additional transistor stages. The current sources mentioned above replace the collector load resistors which were previously used with discrete component transistor stages.

Many advantages were gained in going from a three-stage cascade transistor amplifier to the simpler two-stage circuit mentioned above. The primary advantage is that high-frequency compensation is more easily accomplished in the two-stage circuit because the elimination of the third transistor stage reduces the signal delay through the circuit. Almost all modern integrated operational amplifier designs are of the simple two-stage type and achieve gains in excess of 100,000 in combination with slewing rates of about 0.5 volt/microsecond. (The slewing rate is the maximum rate-of-change of output voltage with time, $dV_0/dt$).

The above prior art amplifiers have two primary disadvantages which circuit designers have been unable to overcome in the past. The first of the disadvantages is that these prior art amplifiers require a relatively high input current which is often too great to permit usage of the amplifier in applications with a high source impedance. The second disadvantage of these prior art operational amplifiers resides in their limited bandwidth and slewing characteristics. Although integrated circuit amplifier bandwidths are presently as great as those of conventional discrete amplifiers, even more improved and increased amplifier bandwidths would open large new market areas where higher speeds are important.

SUMMARY OF THE INVENTION

An object of the present invention is to provide a new and improved operational amplifier utilizing lateral PNP transistors connected so that their operating points are completely independent of the unpredictable common emitter current gain (beta) of the lateral PNP transistors.

Another object of this invention is to provide new and improved operational amplifiers having extremely low input currents.

A further object of this invention is to provide operational amplifiers which may be fabricated in a simple monolithic integrated circuit form and which exhibit improved gain-versus-frequency and slewing characteristics.

A feature of the present invention is a provision of a lateral PNP output transistor connected to a narrow base width input NPN transistor in such a manner that the input transistor is operated at extremely low currents and the output lateral PNP transistor is operated independent of the lateral PNP beta.

Another feature of this invention is the provision of improved integrated circuit operational amplifiers having low-breakdown input NPN transistors with high beta. The NPN transistors are fabricated with a deep emitter diffusion and a very narrow base width and therefore exhibit extremely high current gains and have low input currents.

Another feature of this invention is the provision of various novel differential amplifier circuit configurations including input NPN transistors direct-coupled to output lateral PNP transistors in such a manner that a wideband frequency response is obtained.

A further feature of this invention is the provision of amplifiers having an input NPN transistor with a very low collector-to-emitter breakdown voltage ($BV_{CEO}$). The NPN input transistor is operated in conjunction with a high voltage lateral PNP output transistor, such that the composite amplifier can sustain large input and output voltage swings.

These and other objects and features of this invention will become more fully apparent in the following description of the accompanying drawings.

BRIEF DESCRIPTION OF THE DRAWINGS

FIG. 4 includes emitter-resistors between the amplifier transistors and the single current sink of the amplifier circuit;

FIG. 5 is somewhat similar to FIG. 3 and includes a pair of resistors connected between the single current source and the source current nodes for the amplifier transistors;

FIG. 7 includes a first or input differential amplifier stage, a second or output amplifier stage, bias circuitry, and an output complementary current drive stage connect to the second amplifier stage. The basic input differential amplifier stage has been previously illustrated in FIGS. 3, 4, and 6.

DESCRIPTION OF THE INVENTION

Briefly described, the present invention is directed to a monolithic integrated differential amplifier including input and output transistor pairs. The input transistors are deep-emitter diffused, high beta NPN transistors with a low $BV_{CEO}$, and the output transistors are lateral PNP transistors. The output lateral PNP transistors are connected to the input NPN transistors in such a manner as to clamp the collector-base voltages of the NPN transistors to approximately zero volts. This clamping of the input NPN collector voltages permits the use of relatively low breakdown, high beta input transistors, and yet high voltages can still be applied to the amplifier since the lateral PNP collector-base junctions have high breakdowns. In addition, the NPN collector-base junction leakage currents are reduced almost to zero as a result of the zero volt bias across the collector-base junction. Furthermore, the lateral PNP output transistors have output currents which are independent of the lateral PNP current gains, i.e., betas, since base current variations in the PNP transistors are automatically absorbed by the NPN transistor emitters due to the type of feedback employed.

Figures 1, 2, 3, 4, 5, 6:
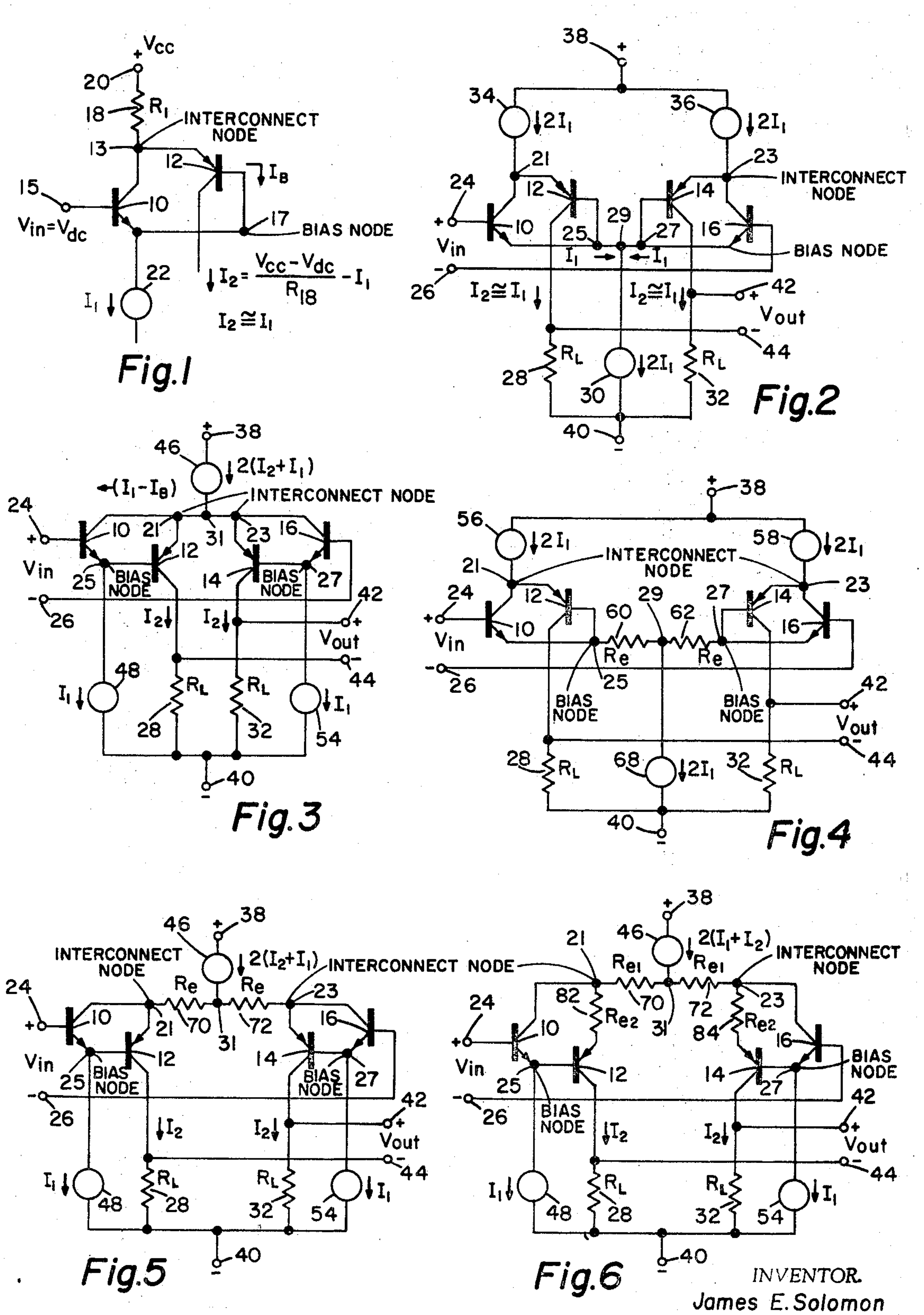
FIG. 1 is a schematic diagram of the NPN-lateral PNP monolithic circuit configuration for one-half of the differential amplifier according to one embodiment of the invention.
FIG. 2 is a schematic diagram of one differential amplifier embodying the present invention and having a pair of current sources and a single current sink.
FIG. 3 is a schematic diagram of another embodiment of the invention and includes a single current source and a pair of current sinks.
FIG. 4 is a schematic diagram of another embodiment of the invention and is somewhat similar to FIG. 2.
FIG. 5 is a schematic diagram of another embodiment of the invention.
FIG. 6 is a schematic diagram of another embodiment of the invention and includes still further emitter resistors for the output lateral PNP transistors of the amplifier circuit. In many cases in FIGS. 1–6, the current sources and sinks could be replaced by resistors with relative large voltages across them and little performance would be sacrificed.

Referring to the drawings in detail, there is shown in FIG. 1 one-half of a differential amplifier according to one embodiment of the present invention. Each half of the amplifier includes one deep diffused NPN input transistor and one lateral NPN transistor connected as shown. In FIG. 1, an NPN input transistor 10 is connected between constant current sink 22 and a collector load resistor 18 and has its base electrode connected to an input terminal 15. The collector load resistor 18 is connected to a first voltage supply terminal 20. The lateral PNP transistor 12 has its emitter connected to an interconnect node 13 and its base connected to the emitter of NPN transistor 10 at a common bias node 17. An output signal is derived from the collector of the lateral PNP transistor 12 and is developed across a collector load impedance (not shown).

Under the usual DC conditions in FIG. 1, the current flowing through resistor 18 is equal to $2I_1$. For a large NPN current gain ($\text{beta}_{NPN}$), the base current of NPN transistor 10 can be assumed to be approximately zero and the collector current $I_2$ of PNP transistor 12 is equal to the difference between the emitter current of transistor 12 and the current leaving node 13. The collector current $I_2$ of the lateral PNP transistor 12 may therefore be expressed as:

$$I_2 \cong \frac{V_{cc} - V_{dc}}{R_{18}} - I_1$$

or $$I_2 \cong 2I_1 - I_1 = I_1$$

where the $V_{dc}$ is equal to DC voltage at the base of NPN transistor 10 and which is the same as the voltage at the emitter of transistor 10 if transistors 10 and 12 have identical base-emitter offset voltages. Therefore the collector current $I_2$ of the lateral PNP transistor 12 is independent of its own common emitter current gain (beta). This is a very important feature of the circuit since the betas of lateral PNP transistors are known to vary widely because of the lateral PNP processing. These betas may vary from one to twenty typically when PNP and NPN transistors are fabricated using a single process. For integrated circuit fabrication the above feature permits the use of lateral PNP transistors which are easily fabricated in monolithic form.

Another important feature of the novel circuit in FIG. 1 is that the DC voltage level $V_{dc}$ at the base of NPN transistor 10 is nearly identical to the voltage level $V_{dc}$ at the emitter of the lateral PNP transistor 12. This feature enables the NPN input transistor 10 to always operate with zero volts across its collector-base junction. With the insurance of zero volts across the collector-base junction of NPN transistor 10 at all times, the NPN transistor 10 may be fabricated using a deep emitter diffusion to produce an input transistor with a very narrow base width and a very high beta on the order of a thousand. This high beta causes the base current for transistor 10 to be very low. In a typical circuit which includes the circuit configuration shown in FIG. 1, the collector current of transistor 10 is in the order of five microamperes and the base current is in the order of five microamperes divided by a thousand or approximately five nanoamperes. This latter figure is two orders of magnitude lower than the input current of the typical state-of-the-art bipolar transistor differential amplifiers.

A second important result of the zero volts bias across the collector-base junction of transistor 10 is that the collector-base leakage current of this transistor must be zero. This is true since junction current cannot flow without the presence of a voltage across the junction. The elimination of this current is important since it can be as large as the normal base current at high temperatures.

For small signal AC operation, the collector current $I_2$ of the lateral PNP transistor 12 may be expressed as:

$$I_2 \cong \frac{V_{in}}{r_{e_{npn}}} \alpha \text{ pnp} \cong \frac{V_{in}}{r_{e_{npn}}} \alpha_0 \frac{\text{pnp}}{1+\frac{S}{\omega\alpha_{pnp}}}$$

Laplace transform operator, where $\alpha$ pnp, the PNP current gain, $\alpha_0\text{pnp}/(1+s/\omega\alpha_{pnp})$ is the short circuit common base current gain of the PNP transistor and $r_{e_{npn}}$ is the small signal emitter resistance of the NPN transistor. Thus, the first corner on the gain-versus-frequency characteristic of a complete differential amplifier with each half thereof connected as shown in FIG. 1 is equal to the grounded base cut off frequency of the lateral PNP transistor 12, $\omega\alpha_{pnp}$. Most prior art amplifiers cut off at a frequency which is beta (PNP) times lower than this frequency.

A complete differential amplifier circuit embodying the invention is illustrated in FIG. 2 and includes a first NPN deep diffused input transistor 10 and a first PNP lateral output transistor 12 as previously described. FIG. 2 further includes a second deep diffused NPN input transistor 16 and a second lateral PNP output transistor 14. A differential input signal is applied to the bases of the first and second NPN input transistors 10 and 16, and a pair of collector load resistors 28 and 32 are connected between the collectors of the first and second PNP output transistors 12 and 14, respectively, and a second voltage supply terminal 40.

The circuit in FIG. 2, which is the differential analog of FIG. 1, is current source biased with first and second current sources 34 and 36 which are connected between a first voltage supply terminal 38 and first and second current input interconnect nodes 21 and 23, respectively. The common bias nodes 25 and 27 for the transistor pairs in FIG. 2 are connected to a common output junction 29, and a constant current sink 30 is connected between junction 29 and the second voltage supply terminal 40. All properties of FIG. 1 which were discussed above apply to FIG. 2.

The circuit in FIG. 2 is operative with a large common mode swing which is approximately equal to the voltage difference between the power supply voltages at terminals 38 and 40. The current sources 34 and 36 may be constructed using lateral PNP transistors as is well known in the art. As previously noted, a major advantage of the differential amplifier in FIG. 2 is that the input NPN devices 10 and 16 operate at zero volts collector-to-base.

This novel feature substantially eliminates leakage current in the input NPN transistors 10 and 16 and permits the use of very low breakdown, high beta input transistors which operate with very low base currents. The NPN input transistors 10 and 16 are fabricated by a double emitter drive process and the high beta NPN input transistors 10 and 16 have deep emitters and very narrow basewidths. Normal beta, high voltage NPN transistors on the same integrated circuit die are given a single emitter drive and have normal basewidths.

If each of the current sources 34 and 36 and the current sink 30 are carrying a constant current equal to $2I_1$, the emitter currents of the input NPN transistors 10 and 16 are equal to $(I_1-I_b)$ where $I_b$ is equal to the PNP transistor base current. For the above conditions the load resistors 28 and 32 conduct a load current approximately equal to $I_1$, regardless of the value of $\beta$ (PNP).

The circuit in FIG. 3 differs from the circuit in FIG. 2 in that a single constant current source 46 is used and is connected between a first voltage supply terminal 38 and a common junction 31 between first and second interconnect nodes 21 and 23. A pair of constant current sinks 48 and 54 are used to set the sum of NPN emitter current and the PNP base current and are connected as shown between common bias nodes 25 and 27 and a second voltage supply terminal 40. The circuit in FIG. 3 is somewhat easier to realize in integrated circuit form than the circuit in FIG. 2 since the circuit in FIG. 3 requires only one PNP current source 46. Also, the circuit of FIG. 3 has a higher large signal current gain than that of FIG. 2. As a result of the latter, $I_1$ can be made smaller than $I_2$ and the input base current can be smaller for FIG. 3 than for FIG. 2.

As in FIGS. 1 and 2, the lateral PNP collector currents $I_2$ in FIG. 3 are independent of PNP transistor beta. The PNP transistors in the circuit of FIG. 3 are essentially common emitter, voltage driven (by the emitters of the NPN transistors) and have a first response pole near $f_T$ of the PNP lateral transistors 12 and 14, where $f_T$ is the frequency at which the common emitter current gain of the PNP transistors is unity. On the other hand, the PNP transistors in FIG. 2 are driven by a current from the collectors of the input NPN transistors and operate in the grounded base mode. The high frequency corners of the circuits of FIGS. 2 and 3 are approximately the same, since the grounded base cut off frequency, $f\alpha$, occurs at approximately $f_T$ where $f_T$ is the transistor common emitter current gain bandwidth product in cycles per second. In other words, the circuit of FIG. 2 has a first high frequency transconductance corner at approximately $f_T$ and the circuit of FIG. 3 has a first high frequency transconductance corner at approximately $f\alpha$.

The circuit in FIG. 4 is similar to the circuit shown in FIG. 2 and has first and second current sources 34 and 36 connected between the first and second interconnect nodes 21 and 23 and a voltage supply terminal 38. The difference between the circuits in FIGS. 2 and 4 is that emitter resistors 60 and 62 are included in the circuit of FIG. 4 to minimize the signal propagation delay through the amplifier. This signal propagation delay is minimized by the small amount of positive feedback provided by the emitter resistors 60 and 62. This positive feedback cancels, to a first order, the dependance of the stage gain on PNP beta. The latter is achieved by inserting the PNP base current, which would otherwise be lost, back into the NPN emitter where it adds to the signal. Thus, to a first order, the effects of the first circuit pole at the $f_T$ of the lateral PNP transistors are cancelled.

The circuit illustrated in FIG. 5 represents a slight variation of the circuit illustrated in FIG. 3 and includes emitter resistors 70 and 72 connected between the current source 46 and the first and second current input nodes 21 and 23, respectively. The primary purpose of resistors 70 and 72, as in FIG. 4, is to add a small amount of differential mode positive feedback and minimize delay. There is an optimum value for resistors 70 and 72 which will provide a minimum propagation delay in the circuit; too much emitter resistance causes complex poles to approach the $j\omega$ axis of the $\sigma+j\omega$ plot of the amplifier, and the latter results in pulse response overshoot. On the other hand, too little emitter resistance for resistors 70 and 72 provides no base current cancellation in the circuit, and the $f_T$ of the lateral PNP transistors degrades the frequency response of the circuit.

The circuit illustrated in FIG. 6 differs from the circuit in FIG. 5 in that lite third and fourth emitter resistors 82 and 84, respectively, have been added in the emitter circuits of lateral PNP transistors 12 and 14. In FIG. 6, the first and second resistors 70 and 72 are used to minimize overshoot and to maximize rise time. Resistors 82 and 84 are selected so that $$\frac{1}{R_{70}+R_{82}}=\frac{1}{R_{72}+R_{84}}$$

is equal to the desired transconductance for the stage. The addition of resistors 82 and 84 thus allow independent optimization of delay and adjustment of gain.

All of the circuits in FIGS. 1 through 6 have been fabricated with lateral PNP transistors 12 and 14 both having common emitter current gains of approximately 15 at 50 microamperes and approximately 5 at 500 microamperes. The NPN transistors 10 and 16 had betas approximately equal to 1000 at 10 microamperes. The circuits in FIGS. 1, 2 and 3 all had nearly identical high frequency corners at the $f_T$ of the lateral PNP transistors 12 and 14, and this $f_T$ was approximately three megahertz.

The addition of emitter resistance as in FIGS. 4 through 6 reduces the circuit delay by as much 25° at the −3db corner of the gain-versus-frequency characteristic. Such improvement is quite significant, since it allows significant reduction of the phase compensation capacitor size (e.g. capacitor 136 in FIG. 7), and the latter results in improved slew rates.

Figure 7:
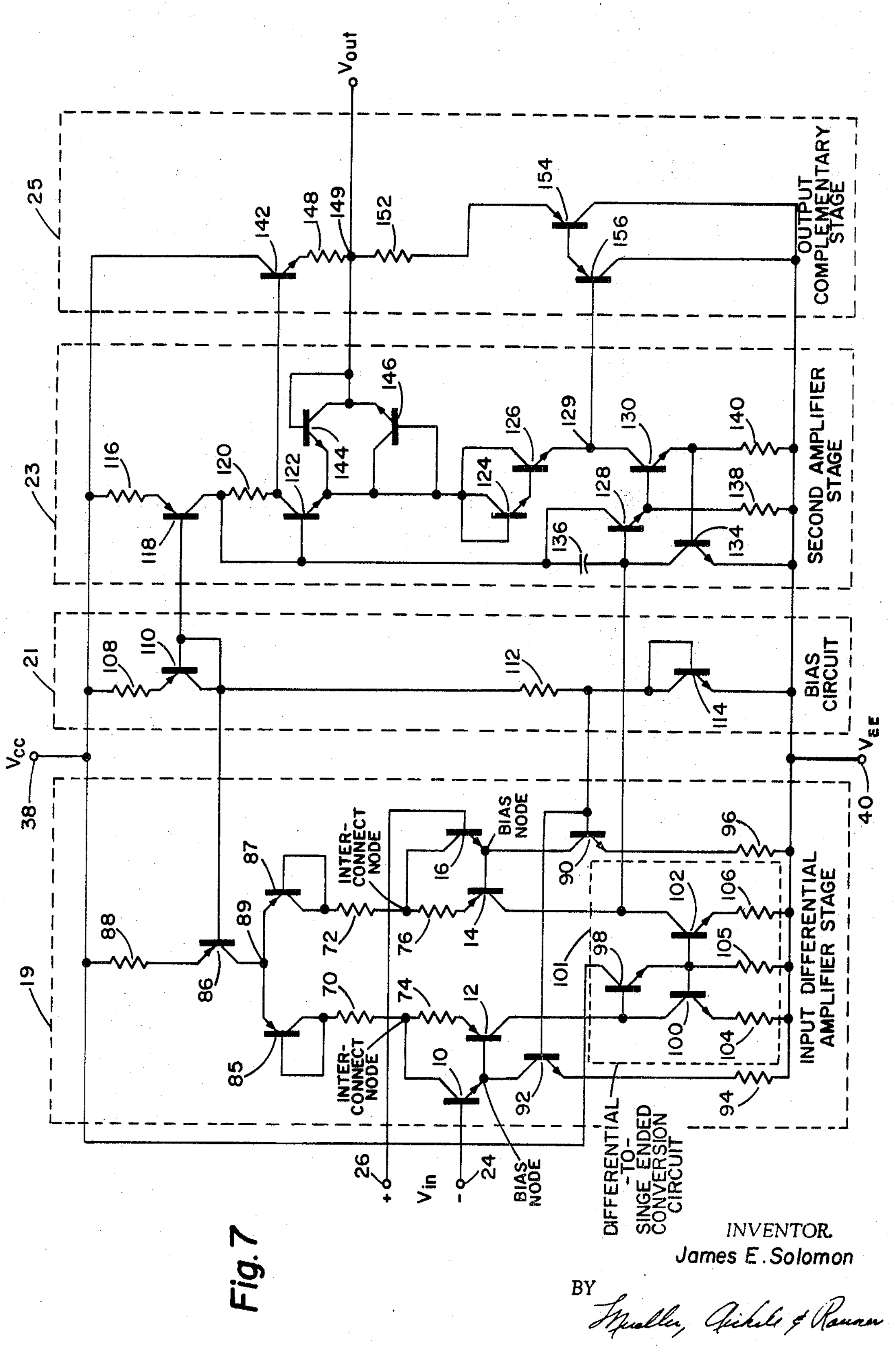
FIG. 7 is a schematic diagram of a complete circuit implementation of an operational amplifier embodying the invention.

FIG. 7 is a circuit diagram for the complete monolithic operational amplifier of the invention and incorporates the differential amplifier portion illustrated in FIG. 6. In addition to the circuitry previously described with reference to FIG. 6, the circuit of FIG. 7 includes a pair of high voltage diodes 85 and 87 (transistors with collector-base junction shorted) connected to the resistors 70 and 72. A current source transistor 86 is connected between the common node 89 for diodes 85 and 87 and a current source resistor 88.

The high voltage diodes 85 and 87 are fabricated using lateral PNP transistors and the collector base junctions of these transistors are shorted. These diodes 85 and 87 are used to provide over voltage protection when the differential input voltage $V_{in}$ exceeds the 7 volt reverse breakdown voltage of the NPN input transistors 10 and 16. Since the lateral PNP transistor base-emitter junctions which form the diodes 85 and 87 are fabricated using light diffusions, the breakdown voltages of these diodes are normally greater than 50 volts. This breakdown voltage is sufficient to prevent destruction of the amplifier for all differential inputs $V_{in}$ less than or equal to the difference between power supply voltages $V_{CC}$ and $V_{EE}$. Since the current-voltage characteristics of diodes 85 and 87 must match precisely to prevent the introduction of an input offset voltage into the circuit, this overvoltage protection is only practical when monolithic integrated circuit fabrication is used.

The input differential amplifier stage 19 also includes a differential-to-single ended conversion circuit 101 in place of the collector load resistor shown in FIG. 6. This differential-to-single ended conversion circuit consists of transistors 98 and 102 and resistors 104, 105, and 106. The feedback pair of transistors 98 and 100 in the differential-to-single ended conversion circuit 101 conducts current from the collector of the output lateral PNP transistor 12 and this develops a voltage at the base terminal of transistor 102 which provides a desired bias voltage for transistor 102. The emitter voltage of transistor 98 biases transistor 102 so that the collector current of transistor 102 is equal to the current supplied by the collector of transistor 12. Thus, the differential-to-single ended conversion circuit 101 accepts balanced currents from the collectors of transistors 12 and 14.

The current output from the conversion circuit 101 which enters the base of transistor 128 in the second amplifier stage 23 is equal to the difference between the collector current of transistor 12 and the collector current of transistor 14. Therefore, the amplifier circuit responds only to differential inputs and is, to a large degree, insensitive to common mode input voltages.

Another feature of the differential-to-single ended conversion circuit 101 is that it presents a low impedance to the collector of transistor 12 due to the connection of emitter follower 98 between the collector of transistor 12 and the emitter resistor 105. This latter feature broadbands the collector terminal of transistor 12. At the same time, however, the conversion circuit 101 presents a very high impedance to the collector of output transistor 14, and such high impedance results in a high first stage voltage gain.

The second amplifier stage 23 for the operational amplifier includes a single ended, common collector-common emitter cascade connection of transistors 128 and 130, respectively. A current source load consisting of PNP transistor 118 and resistor 116 sets the DC current level in the second amplifier stage 23. The second amplifier stage 23 employs a frequency compensation capacitor 136 which is coupled between the base of emitter follower transistor 128 and the collector of common emitter transistor 130. Th capacitor 136 generates a dominant pole of the transfer function of the amplifier at the base of transistor 128, and also simultaneously broadbands the output node 129 of the common emitter transistor 130. The dominant pole at the base of transistor 128 is generated by Miller multiplication of the compensation capacitor 136, and such multiplication causes a large effective capacitance to appear between the base of transistor 128 and supply node $V_{EE}$. The output node 129 of the common emitter amplifier stage 23 is broadbanded as the result of the shunt feedback action provided by capacitor 136, and this feedback reduces the output resistance of the common emitter amplifier stage 23 at high frequencies.

The output stage 25 of the amplifier is a complementary emitter follower class AB circuit including transistors 142, 154, and 156. A pair of resistors 148 and 152 interconnects the emitter of NPN transistor 142 to the emitter of PNP transistor 154, and the amplifier output voltage is derived at node 149. A practical class AB operating point for the amplifier is established in the output transistors 142, 154, and 156 by driving them from the network consisting of transistors 122, 124 and 126 and resistor 120. The Darlington connected transistors 124 and 126 have voltage-current characteristics which match and track the output PNP transistors 154 and 156 during variations in ambient temperature. The transistor 122, and its associated resistor 120, is a network specifically designed to provide a voltage drop at the base of transistor 142 equal to one base-emitter diode drop $V_{BE}$ minus a small voltage drop in resistor 120. The purpose of the voltage drop across resistor 120 is to cause the quiescent idling current of output transistors 142 and 154 to be less by a factor of about five than the quiescent idling current through bias transistors 122, 124 and 126, in order to minimize quiescent power dissipation for the amplifier.

The bias circuit 21, from which all operating currents for the complete amplifier are derived, includes a relatively large valued bleeder resistor 112 connected between a diode 110 and diode 114. Due to the fact that the amplifier is fabricated in monolithic integrated form, the voltage-current characteristic of diode 110 matches the base-emitter junctions of current source transistors 118 and 86; therefore, the currents flowing through transistors 86 and 118 track with the current flowing through resistor 112. Resistors 88, 116 and 108 are selected to provide a desired ratio of currents in transistors 86 and 118 to the current flowing in transistor 110. In addition, the current source transistors 92 and 90 in the input differential amplifier stage 19 are biased to conduct a small value of current dependent upon the ratio of the voltage drop across diode 114 to the sum of the base-emitter voltage drops of transistors 90 and 92 plus the voltage drops across resistors 94 and 96, respectively. The purpose of resistors 94 and 96 is to generate a smaller value of current in current sources 90 and 92 than the current flowing in the bleeder resistor 112 without resorting to the use of high valued resistors. These high valued resistors are difficult to fabricate in integrated circuit form.

The output short circuit protection network of the amplifier circuit includes diodes 144 and 146, resistors 148 and 152, transistor 134 and resistor 140. The function of the short circuit protection network is as follows: If the output terminal $V_{out}$ is shorted to ground or to a power supply terminal and an input signal applied, the output of the amplifier will attempt to supply an infinite current and burn out transistors 142 or 154. If signal is swinging positive and node 149 is grounded, then diode 146 conducts if the current exceeds about 12 milliamperes. If signal swing is negative and node 149 is grounded, then diode 144 conducts if the current exceeds about 12 milliamperes. (Also, the currents through the diodes are limited to safe non burn-out levels while transistors 142 and 154 would otherwise supply very large currents since there is nothing to limit their current.) Burn-out is prevented by the current limiting action of the diodes 144 and 146. When the output current passing through resistors 148 and 152 is large enough to develop a voltage drop at terminal 149 of one base-emitter offset voltage $V_{BE}$, either diode 144 or diode 146 is turned on and all further currents supplied to the load must flow only through one of these diodes. The total output current through node 149 is equal to one base-emitter voltage drop divided by the value of resistor 148 or 152 plus the current flowing through diode 144 or diode 146. Diode 146 turns on for positive going output short circuits and diode 144 turns on for negative going output short circuits. For positive going outputs, the current flowing through diode 146 is limited to the value of current conducted by the current source 118, and this current is negligible when compared to the output current of output NPN transistor 142. When a negative going short circuit condition occurs, the current through diode 144 is set by the collector current of transistor 130. This current could be large enough to burn out transistor 130 except for the fact that it is limited by a sampling resistor 140 and a shut-down transistor 134. When the current passing through diode 144 into transistor 130 becomes large enough that the voltage drop across resistor 140 reaches one $V_{BE}$, transistor 134 turns on and robs the drive current from transistor 128. This action holds transistor 130 in a state of constant current conduction which is limited to one diode drop ($V_{BE}$) divided by the value of resistor 140. Thus, the currents through both transistor 154 and diode 144 are separately limited for negative going output shorts and the amplifier remains protected against burn-out.

Listed in the table below are typical values of the passive circuit elements used in a circuit of the type shown in FIG. 7 which has been built and successfully operated. However, this table should not be construed as limiting the present invention in any respect.

TABLE

| Circuit elements: | | Value |
|---|---|---|
| Resistors: | | |
| R70 | ohms | 500 |
| R72 | do | 500 |
| R74 | do | 1500 |
| R76 | do | 1500 |
| R88 | do | 4000 |
| R94 | do | 1000 |
| R96 | do | 1000 |
| R104 | do | 1000 |
| R105 | do | 39000 |
| R106 | do | 1000 |
| R108 | do | 1000 |
| R112 | do | 56000 |
| R116 | do | 1000 |
| R120 | do | 340 |
| R138 | do | 39000 |
| R140 | do | 51 |
| R148 | do | 40 |
| R152 | do | 50 |
| Capacitor: | | |
| 136 | picofarads | 35 |

Accordingly, the above-described invention is limited only by way of the following appended claims.

I claim:

1. An amplifier circuit including in combination:
(a) an input semicoiductor device of one conductivity type having input, output, and common electrodes, with a DC offset voltage between said input and common electrodes,
(b) an output semiconductor device having input, output and common electrodes, with a DC offset voltage between said input and common electrodes of said output semiconductor device approximately equal in magnitude and sign to said DC offset voltage of said input semiconductor device,
(c) means for DC coupling said common electrodes of said input and output semiconductor devices to a common bias node so that said input and output semiconductor devices conduct a bias current to said common bias node, and
(d) said output electrode of said input semiconductor device connected directly to said input electrode of said output semiconductor device so that the potential on said input electrode of said input semiconductor device is equal to the potential on said output electrode of said input semiconductor device and the potential on said input electrode of said output semiconductor device; said output semiconductor device thereby fixing the potential difference between input and output electrodes of said input semiconductor device at approximately zero volts, thereby permitting the fabrication of said input semiconductor device with a low breakdown voltage and a high current gain.

2. The circuit defined in claim 1 which further includes means connected to said output electrode of said output semiconductor device for developing an amplified output signal in response to input signals applied to said input electrode of said input semiconductor device.

3. The circuit defined in claim 2 which further includes a constant current sink connected between said common bias node and a point of reference potential and conducting a substantially constant current from said common bias node equal to $I_1$ where the current flowing into said interconnect node is equal to $2I_1$, the current flowing out of said common electrode of said input semiconductor device is equal to $I_1 - I_B$ where $I_B$ is the common electrode current of said output semiconductor device; the output electrode current of said output semiconductor device being approximately equal to $I_1$ and independent of the current gain of said output semiconductor device.

4. A different amplifier including in combination
(a) a first input transistor having a collector, a base and an emitter,
(b) a first output transistor having a collector, a base and an emitter, said first input transistor being opposite in conductivity to said first output transistor, the collector of said first input transistor and the emitter of said first output transistor being DC coupled to a first interconnect node, and the emitter of said first input transistor and the base of said first output transistor being DC coupled to a first common bias node,
(c) a second input transistor having an emitter, a base and a collector,
(d) a second output transistor having an emitter, a base and a collector, said second input transistor being opposite in conductivity to said second output transistor and having its collector DC coupled to the emitter of said second output transistor at a second interconnect node, the emitter of said second input transistor DC coupled to the base of said second output transistor at a second common bias node, and
(e) and means coupled to the collectors of said first and second output transistors from which an amplified output signal may be derived.

5. The differential amplifier defined in claim 4 which further includes:
(a) a first current source connected between said first interconnect node and a first voltage supply terminal,
(b) a second current source connected between said second interconnect node and said first voltage supply terminal,
(c) a constant current sink connected between a common junction between said first and second bias nodes and a second voltage supply terminal, and
(d) first and second output impedance means connected respectively between the collectors of said first and second output transistors and said second voltage supply terminal and developing thereacross output voltages in response to a differential input voltage applied to the input terminals of said first and second input transistors, respectively.

6. The differential amplifier defined in claim 4 which further includes:
(a) a current source connected between a common junction between said first and second interconnect nodes and a first voltage supply terminal,
(b) a first current sink connected between said first common bias node and a second voltage supply terminal,
(c) a second constant current sink connected between said second common bias node and said second voltage supply terminal, and
(d) first and second load impedance means connected respectively between said first and second output transistors and said second voltage supply terminal for developing there-across output voltages in response to a differential input signal applied to the bases of said first and second input transistors.

7. The differential amplifier defined in claim 5 which further includes:
(a) a first impedance connected between said first common bias node and said common junction between said first and second common bias nodes,
(b) a second impedance connected between said second common bias node and said common junction between said first and second common bias nodes, said first and second impedances minimizing the signal propagation delay through said amplifier by providing a small amount of positive feedback in said amplifier which, to a first order, minimizes the detrimental effect of base currents on the gain-versus-frequency characteristic of the amplifier.

8. The differential amplifier defined in claim 6 which further includes:
(a) a first internal circuit impedance connected between said constant current source and said first interconnect node, and
(b) a second internal circuit impedance connected between said constant current source and said second interconnect node, said first and second internal circuit impedances having values selected to minimize the signal propagation delay through said amplifier and to improve the gain-versus-frequency characteristic thereof.

9. The amplifier defined in claim 8 which further includes:
(a) a third internal circuit impedance connected between said first interconnect node and the emitter of said first output transistor, and
(b) a fourth internal circuit impedance connected between said second interconnect node and the emitter of said second output transistor, said third and fourth internal circuit impedances selected to provide a desired transconductance for the amplifier.

10. A differential amplifier having an input differential amplifier stage which includes, in combination:
(a) a first input transistor having a collector, a base and an emitter,
(b) a first output transistor having a collector, a base and an emitter, said first input transistor being opposite in conductivity to said first output transistor, the collector of said first input transistor and the emitter of said first output transistor being DC coupled to a first interconnect node, and the emitter of said first input transistor and the base of said first output transistor being DC coupled to a first common bias node,
(c) a second input transistor having an emitter, a base and a collector,
(d) a second output transistor having an emitter, a base and a collector, said second input transistor being opposite in conductivity to said second output transistor and having its collector DC coupled to the emitter of said second output transistor at a second interconnect node, the emitter of said second input transistor DC coupled to the base of said second output transistor at a second common bias node,
(e) first and second matched diodes connected, respectively, between said first and second interconnect nodes and a current source for said differential amplifier, said matched diodes providing overvoltage protection for large voltage swings applied to said first and second input transistors, and
(f) differential-to-single ended conversion circuit means DC coupled to the collectors of said first and second output transistors for providing a single ended output signal.

11. The amplifier defined in claim 10, which further includes:
(a) bias circuit means connected to said input differential amplifier stage for setting the DC current levels therein,
(b) a second amplifier stage connected to said differential-to-single ended conversion circuit means and including a common collector transistor cascaded to a common emitter transistor between first and second power supply terminals, and
(c) an output transistor stage including complementary push-pull transistors DC coupled between said first and second power supply terminals and driven by said second amplifier stage for providing an amplified output signal.

12. The amplifier defined in claim 11 wherein said input differential amplifier stage further includes:
(a) a first internal circuit impedance connected between said first matched diode and said first interconnect node,
(b) a second internal-circuit impedance connected between said second matched diode and said second interconnect node, said first and second internal circuit impedances having values selected to minimize the signal propagation delay through said amplifier and to improve the gain-versus-frequency characteristic thereof,
(c) a third internal circuit impedance connected between said first interconnect node and the emitter of said first output transistor, and
(d) a fourth internal circuit impedance connected between said second interconnect node and the emitter of said second output transistor, said third and fourth internal circuit impedances selected to provide a desired transconductance for the amplifier.

13. The amplifier defined in claim 12 which further includes a pair of parallel connected diodes connected between an output terminal of said output transistor stage and said second amplifier stage, one of said parallel connected diodes being biased to conduction on positive short circuits and the other of said parallel connected diodes being bias conductive on negative short circuits to thereby prevent burnout of said amplifier.

14. The amplifier defined in claim 13 which further includes a pole compensating capacitor coupled between the input and output of said second amplifier stage for generating a dominant pole of the transfer function of the amplifier in said second amplifier stage and for broadbanding the collector of said common emitter transistor in said second amplifier stage.

15. The amplifier defined in claim 14 wherein:
(a) said differential-to-single ended conversion circuit means includes first, second and third transistors, each having an emitter, a base and a collector, said first and second transistors in said conversion circuit means connected respectively between the collectors of said first and second output transistors in said input differential amplifier stage and said second voltage supply terminal, and
(b) said third transistor in said conversion circuit means having the base thereof connected to the collector of said first output transistor and having the emitter thereof connected to the base of said second transistor in said conversion circuit means, the output of said input differential amplifier stage being derived from the collector of said second transistor in said conversion circuit means, said second and third transistor in said conversion circuit means presenting a low impedance to the collector of said first output transistor and presenting a high impedance to the collector of said second output transistor to thereby provide a relatively high voltage gain in said input differential amplifier stage, the collector of said second transistor in said conversion circuit means and the collector of said second output transistor in said input differential amplifier stage being connected to a common output node to which said second amplifier stage is connected.

References Cited

UNITED STATES PATENTS

| | | | |
|---|---|---|---|
| 3,177,414 | 4/1965 | Kurosawa et al. | 330—38 X |
| 3,373,369 | 3/1968 | Cones | 330—17 X |

JOHN KOMINSKI, Primary Examiner

L. J. DAHL, Assistant Examiner

U.S. Cl. X.R.

330—17